(12) United States Patent
Barth, Jr.

(10) Patent No.: US 8,238,168 B2
(45) Date of Patent: Aug. 7, 2012

(54) VDD PRE-SET OF DIRECT SENSE DRAM

(75) Inventor: John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 12/770,976

(22) Filed: Apr. 30, 2010

(65) Prior Publication Data

US 2011/0267916 A1     Nov. 3, 2011

(51) Int. Cl.
    *G11C 11/34* (2006.01)
(52) U.S. Cl. ............ 365/185.25; 365/222; 365/189.05; 365/226
(58) Field of Classification Search ............. 365/185.25, 365/222, 189.05, 226
    See application file for complete search history.

(56) References Cited

U.S. PATENT DOCUMENTS

| | | | |
|---|---|---|---|
| 5,574,687 A | 11/1996 | Nakase | |
| 5,835,414 A | 11/1998 | Hung et al. | |
| 5,875,139 A | 2/1999 | Semi | |
| 5,973,985 A * | 10/1999 | Ferrant | 365/230.05 |
| 6,301,140 B1 | 10/2001 | Lachman et al. | |
| 6,449,201 B1 | 9/2002 | Kojima | |
| 6,950,326 B2 | 9/2005 | Suzuki | |
| 2008/0117700 A1 | 5/2008 | Nakamura | |
| 2008/0181038 A1 | 7/2008 | Clinton | |
| 2008/0247221 A1 | 10/2008 | Houston | |
| 2009/0147605 A1 | 6/2009 | Rengarajan et al. | |

OTHER PUBLICATIONS

Sunaga et al., "A Full Bit Prefetch DRAM Sensing Circuit," IEEE Journal of Solid-State Circuits, vol. 31, No. 6, Jun. 1996, pp. 767-772.
Nakano et al., "A Dual Layer Bitline DRAM Array with Vcc/Vss Hybrid Precharge for Multi-Gigabit DRAMs," IEEE, Symposium on VLSI Circuits Digest of Technical Papers, 1996, pp. 190-191.
Eto et al., "A 1-Gb SDRAM with Ground-Level Precharged Bit Line and Nonboosted 2.1-V Word Line," IEEE Journal of Solid-State Circuits, vol. 33, No. 11, Nov. 1998, pp. 1697-1702.

* cited by examiner

*Primary Examiner* — Jason Lappas
(74) *Attorney, Agent, or Firm* — Gibb & Riley, LLC; David A. Cain, Esq.

(57) ABSTRACT

A direct sense memory array architecture and method of operation includes a plurality of memory cells where a bit-line restore voltage level is optimized to reduce memory cell leakage during a first inactive period, and a bit-line preset voltage level is optimized for signal sensing during a second active period. The architecture includes a sense head having of a pair of cross coupled gated inverters. Each of the gated inverters is responsive to a first and second gate control signal which can independently gate a power supply to the inverter circuit within each gated inverter. During the second active period, a first gated inverter senses the data state on the first bit-line, and a second gated inverter performs a preset and write-back function on the first bit-line.

20 Claims, 6 Drawing Sheets

VDD PRE-SET OF DIRECT SENSE DRAM

BACKGROUND

1. Field of the Invention

The present invention generally relates to a method of operating and a memory array of Dynamic Random Access Memory (DRAM) cells. More particularly, it relates to improving the sensing of a high data state in the DRAM cell.

2. Description of the Related Art

In various systems applications, SRAMs (Static Random Access Memories), which operate faster than DRAMs, have been employed as routers, hubs or cache memories for CPUs (Central Processing Units). However, the development of highly efficient and multifunctional information and communication systems, mandate an increase in memory capacity. The lower cost per bit of DRAM leads to a more cost efficient storage solution than SRAM. By implementing system storage with DRAM, overall bandwidth can be improved for a wide I/O (input/output) data path or a multibank memory. However, compared with SRAMs, DRAMs are remarkably slower in respect to read/write access. Consequently, the use of DRAMs is performance limited.

In the operation of DRAM (Dynamic Random Access Memory) devices, it is required to maintain data stored in a charge storage cell of an array for a maximum retention period without performing a refresh operation in order to offer high availability and low power consumption. When competing with Static RAM (SRAM) devices, it is also desirable to offer high performance with the same DRAM design.

In the current state of the art there are DRAM designs that offer either high retention times for the stored data or high performance.

A conventional DRAM sensing scheme is known as half-VDD sensing, in which both the true and complementary bit-lines are pre-charged to a value approximately halfway between a logic 1 voltage (VDD) and a logic 0 voltage (ground, or GND). When a cell is coupled to a pre-charged bit-line, the voltage will then slightly increase or decrease, depending on the value of the bit stored in the cell, thus creating a differential voltage with respect to the complementary bit-line and VDD/2.

However, for performance reasons, a ground sensing scheme pre-charges the bit-line pair to ground prior to a read operation. Because of the pre-charging to ground, reference word lines are needed to place a reference voltage (e.g., (Vread1−Vread0)/2) on either the bit-line or the complementary bit-line in order to be able to read a 0 bit.

Conventional DRAMs use sensing schemes that require amplifiers capable of sensing small sense signals. One way to amplify small sense signals has been shown to be a cross-couple sense amplifier, as is well known in the art. These cross-couple sense amplifiers require balanced true and complement bit-lines to perform and operate reliably.

In conventional DRAMs, the sense signal from a memory cell is generated by charge sharing the charge stored in the memory cell with a pre-charged bit-line, and then comparing the developed sense signal on the pre-charged bit-line to a reference bit-line.

U.S. Pat. No. 7,342,839 to Barth, Jr. is incorporated herein by reference. This reference demonstrates that 4T and 6T and Cross Coupled DRAMs require a strong Write 1, a high VPP is required to overcome Array Device Vt sigma, and 4T and 6T leakage issues at High VDD/High Temp manifests as Read 0's margin. Additionally, cross couple small signal is sensitive to noise, wherein a device mismatch mitigated by Body Tied Sense Pair, a line-to-line couple requires Bit-Line Twisting, and GND Pre-Charge Requires a Reference Cell that is susceptible to VREF Noise.

Consequently, there is a need for a direct sense system to minimize sub-Vt leakage in an SOI technology thereby improving the sensing of a high data state in a DRAM cell.

BRIEF SUMMARY

A method of an embodiment of the invention determines whether a memory array is in either an inactive period or an active period. A bit-line voltage level of the memory array is maintained at a first voltage level during inactive periods, and the bit-line voltage level of the memory array is maintained at a second voltage level during active periods. The inactive periods include times when the memory array is not being sensed, and the active periods include times when the memory array is being sensed. The first voltage level includes a voltage level that is optimized to reduce memory cell leakage, and the second voltage level includes a voltage level that is optimized for signal sensing.

A memory array of an embodiment of the invention includes a plurality of dynamic random access memory (DRAM) cells connected to a bit-line. Each DRAM cell includes an N-type field effect transistor (NFET) access transistor coupled to the bit-line. The method maintains the first voltage level at a level lower than the second voltage level. In an alternative embodiment, the first voltage level is maintained at a zero (0) level, and the second voltage level is maintained at a normal operating voltage level of the memory array.

In an alternative embodiment, each DRAM cell includes a P-type field effect transistor (PFET) access transistor coupled to the bit-line. The method maintains the first voltage level at a level higher than the second voltage level. In an alternative embodiment, the first voltage level is maintained at a normal operating voltage level of the memory array, and the second voltage level is maintained at a zero (0) level.

Another embodiment of the invention a method determines whether a direct sense memory array is in one of an inactive period and an active period, and a first independently gated power supply maintains a bit-line voltage level of a direct sense memory array at a first voltage level during inactive periods, and a second independently gated power supply maintains the bit-line voltage level of the direct sense memory array at a second voltage level during active periods. The inactive periods include times when the direct sense memory array is not being sensed, and the active periods include times when the direct sense memory array is being sensed. The first voltage level includes a voltage level that is optimized to reduce memory cell leakage, and the second voltage level includes a voltage level that is optimized for signal sensing.

Another embodiment of the invention includes a memory array having a plurality of bit-lines, a plurality of memory cells, where each memory cell of the memory cells is connected to a corresponding bit-line of the bit-lines by an access transistor. A first circuit is connected to the bit-lines and maintains the bit-lines at a first voltage level during the inactive periods, and a second circuit is connected to the bit-lines and maintains the bit-lines at a second voltage level during active periods. The inactive periods includes times when the memory array is not being sensed, the active periods includes times when the memory array is being sensed. The first voltage level includes a voltage level that is optimized to reduce memory cell leakage, and the second voltage level includes a voltage level that is optimized for signal sensing.

Another embodiment of the invention includes a direct sense memory array includes a plurality of bit-lines, a plurality of dynamic random access memory (DRAM) cells, where each DRAM cell of the DRAM cells is connected to a corresponding bit-line by an access transistor. A first independently gated power supply is connected to the bit-lines and maintains the bit-lines at a first voltage level during inactive periods. A second independently gated power supply connected to the bit-lines and maintains the bit-lines at a second voltage level during active periods. The inactive periods includes times when the direct sense memory array is not being sensed, and the active periods includes times when the direct sense memory array is being sensed. The first voltage level includes a voltage level that is optimized to reduce memory cell leakage, and the second voltage level includes a voltage level that is optimized for signal sensing.

Another embodiment of the invention includes a direct sense memory array architecture includes a plurality of memory cells and a plurality of corresponding bit-lines and word lines connected to the respective memory cells. A bit-line restore voltage level is optimized to reduce memory cell leakage during a first inactive period, and a bit-line preset voltage level is optimized for signal sensing during a second active period.

The memory array has a plurality of DRAM cells connected to a bit-line. Each DRAM cell has an NFET access transistor coupled to the bit-line. The bit-line is restored to a low level during the first inactive period, and the bit-line is preset to a higher level during the second active period.

The DRAM cell also has a PFET access transistor coupled to the bit-line. The bit-line is restored to a high level during the first inactive period, and the bit-line is preset to a lower level during the second active period.

The direct sense memory array architecture includes a sense head having of a pair of cross coupled gated inverters each having an input and an output. The input of a first gated inverter is coupled to a first bit-line and the output of a second gated inverter, and the input of the second gated inverter is coupled to a second bit-line and the output of the first gated inverter.

Each of the first and the second gated inverters is responsive to a first and second gate control signal which can independently gate a power supply to the inverter circuit within each gated inverter. During the second active period, a first gated inverter senses the data state on the first bit-line, and a second gated inverter performs a preset and write-back function on the first bit-line.

With these novel features, the embodiments of the invention may provide a method of operating a DRAM sensing architecture where a direct sense system has bit-lines restored to GND to minimize sub-Vt leakage in an SOI technology, and then presets a selected bit-line to Vdd prior to sensing to improve sensing of a high data state in the DRAM cell.

BRIEF DESCRIPTION OF THE SEVERAL VIEWS OF THE DRAWINGS

The foregoing and other exemplary purposes, aspects and advantages will be better understood from the following detailed description of an exemplary embodiment of the invention with reference to the drawings, in which.

DETAILED DESCRIPTION

The embodiment of the invention are directed to a VDD pre-set method that has a benefit of a high transfer ratio where an NFET array device favors a VDD pre-charge. With this method, a shift is made of a signal from a Write "1" dependence to a Write "0" dependence. This is beneficial since "0s" write and read much faster with NFET array devices, and "0s" have better retention characteristics, that is, they are not subject to the leaking phenomenon of "1" in high VDD/high temperature environments. Additionally, another benefit of the shift to Write "0" dependence if that substrate on insulator (SOI) requires GND pre-charge to control floating body.

The embodiment of the invention is directed toward a hybrid solution of pre-charging a bit-line to GND for a standby period, and pre-setting the bit-line to VDD prior to sensing. This pre-charging of the bit-line to VDD prior to pre-setting the bit-line results in faster read and write performance.

Figure 1:
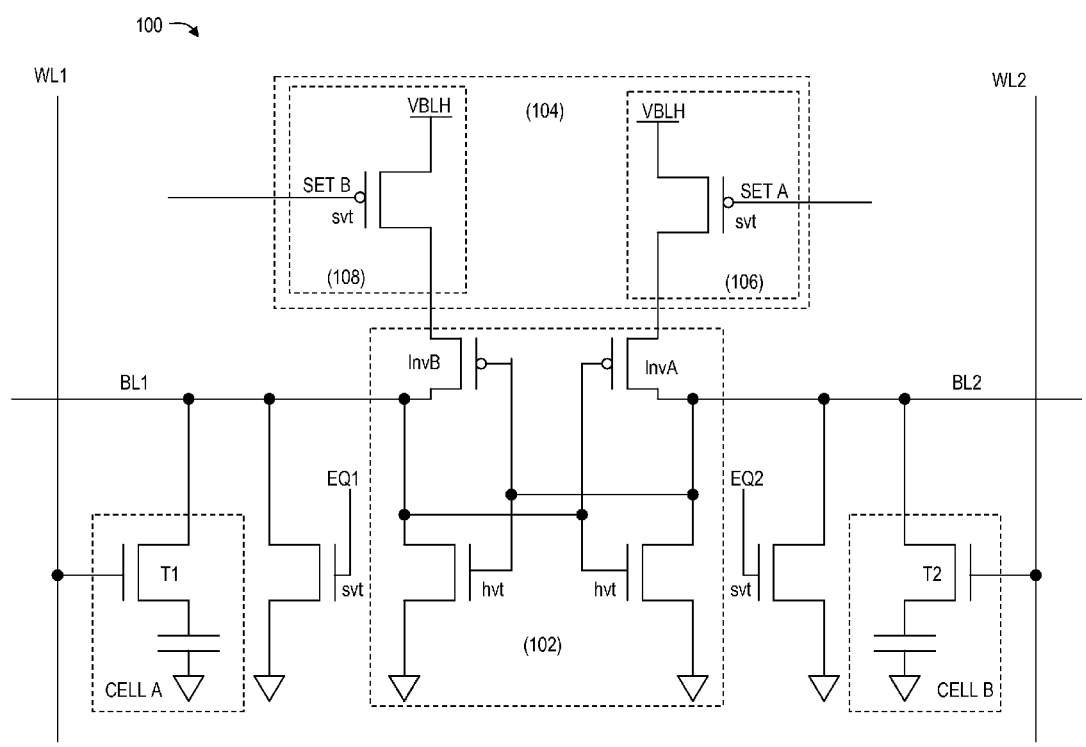
FIG. 1 illustrates a schematic circuit diagram of an embodiment of the invention.

Referring to FIG. 1, one embodiment of the invention includes a memory array 100 having a plurality of memory cells, represented only in part by elements CELL A, CELL B, that are each connected to a corresponding plurality of bit-lines BL1, BL2 and word lines WL1, WL2. Each memory cell CELL A, CELL B is connected to a corresponding bit-line, BL1, BL2 by an access transistor, T1, T2. EQ pre-charge NFET devices EQ1 and EQ2 keep bit-lines BL1 and BL2, respectively, at a first voltage level during inactive periods. A first circuit 102 representing gated inverters InvA and InvB is connected to the bit-lines BL1, BL2, respectively. A second circuit 104 is connected to the bit-lines BL1, BL2, and maintains the bit-lines at a second voltage level during active periods. The inactive periods include times when the memory array, (represented in part by CELL A, CELL B), is not being sensed by the first sensing circuit 102, and the active periods includes times when the memory array is being sensed by the first sensing 102. The first voltage level includes a voltage level that is optimized to reduce memory cell leakage in CELL A and CELL B, for example, and the second voltage level includes a voltage level that is optimized for signal sensing by the sensing circuit 102. Memory cells, CELL A and CELL B represent random access memory (DRAM) cells, where each DRAM cell of the DRAM cells is connected to the corresponding bit-line, BL1, BL2 by an access transistor, T1, T2, respectively. A first independently gated power supply 106 having a power supply line VBLH, (Voltage Bit-Line High), is connected to the bit-lines, BL1, BL2 via the sensing amplifier circuit 102. The first independently gated power supply 104 maintains the bit-lines, BL1, BL2, at a first voltage level during inactive periods. A second independently gated power supply 108 is connected to the bit-lines, BL1, BL2, via the sensing amplifier circuit 102. The second independently gated power supply 108 maintains the bit-lines, BL1, BL2, at a second voltage level during active periods. The inactive periods includes times when the direct sense memory array, either CELL A or CELL B, is not being sensed, and the active periods includes times when the direct sense memory array, the other of CELL A or CELL B is being sensed. The first voltage level includes a voltage level that is optimized to reduce memory cell leakage in CELL A and CELL B, and the second voltage level includes a voltage level that is optimized for signal sensing by the sensing amplifier circuit 102. Each DRAM cell, for example, CELL A, CELL B, has an NFET access transistor T1, T2 coupled to the bit-line BL1, BL2, respectively. The bit-line BL1, BL2 is restored to a low level during the first inactive period, when the direct sense memory array, either CELL A or CELL B, is not being sensed, and the bit-line BL1, BL2 is preset to a higher level during the second active period when the other of CELL A or CELL B is being sensed. The DRAM cell has a PFET access transistor SET A, SET B coupled to the bit-line via the pre-charge circuit 104. The bit-line BL1, or BL2, is restored to a high level during the first inactive period, and the bit-line BL1, or BL2, is preset to a lower level during the second active period. The direct sense memory array architecture includes a sense head/amplifier 102 having of a pair of cross coupled gated inverters InvA, InvB, each having an input and an output. The input of a first gated inverter, for example InvA, is coupled to a first bit-line, for example, BL2, and the output of a second gated inverter InvB, and the input of the second gated inverter InvB, is coupled to a second bit-line, for example, BL1, and the output of the first gated inverter InvA. Each of the first and the second gated inverters, InvA, InvB, is responsive to a first and second gate control signal, SET A, SET B, of independent circuits 106, 108, respectively, which can independently gate a power supply VBLH to the inverter circuit in sense amplifier 102 within each gated inverter, InvA, InvB. During the second active period, a first gated inverter, for example, InvA, senses the data state on the first bit-line, for example, BL1, and a second gated inverter, InvB, performs a preset and write-back function on the first bit-line BL1.

FIG. 2 illustrates a graph representing preset, sense and write-back time periods. Generally, the preset time period is where the bit-line being sensed, (BL1, for example), is driven to the second voltage level, (Vdd), and then floated prior to sensing. The SET signal that initiates the preset, (SETB for example), is only a short duration pulse, long enough to charge the BL being sensed (BL1) to the second voltage level (Vdd). When the BL being sensed has reached the second voltage level (Vdd), the SET performing the preset, (SETB, for example), is returned inactive ending the preset period.

The sensing time period begins with WL activation, (WL1, for example), to access the cell data while the other SET, (SETA, for example), can be activated and held for the remainder of the cycle to enable one gated inverter (InvA) for sensing.

Figure 2A:
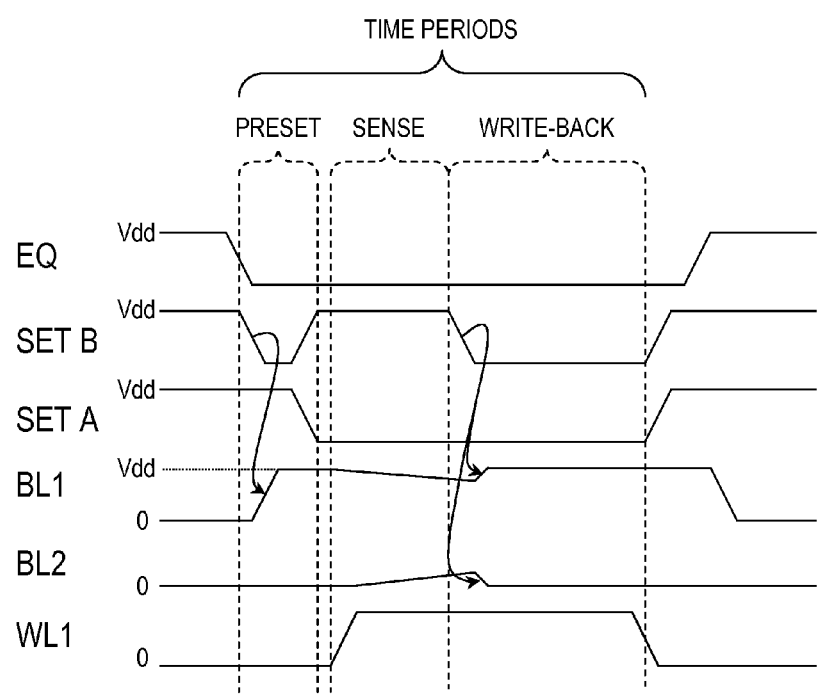
FIG. 2A illustrates a graphical representation of an embodiment of the invention.

After the sensing time period is complete, a write back period begins where the SET, (SETB, for example), of the bit-line being sensed (BL1) is activated to write-back data onto the BL being sensed. The arrows in FIG. 2A depict the timing events, for example the arrow in preset time period shows the falling edge event of the SETB, causes the rising edge event of BL1. Additionally the falling edge event of SETB during the write back period causes the restore of BL1 to VDD and BL2 to GND.

Figure 2B:
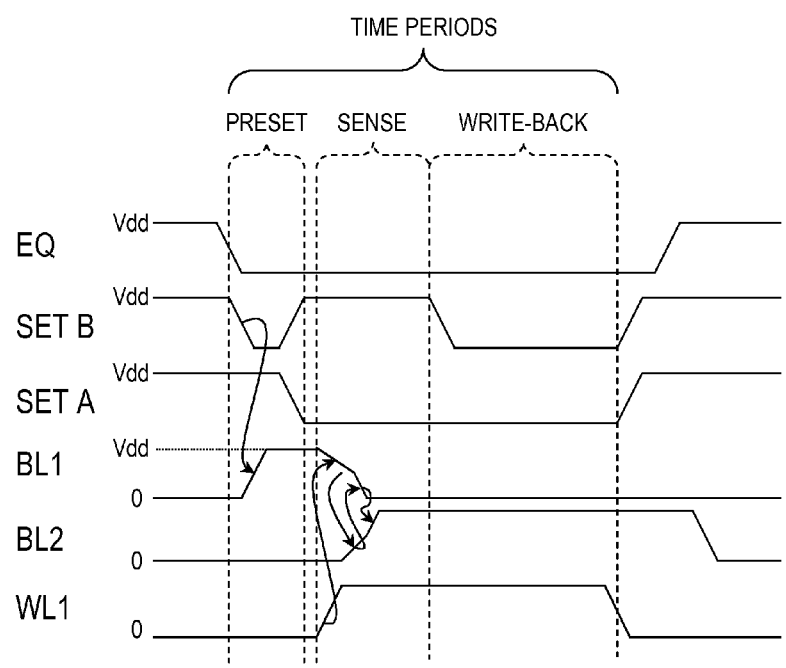
FIG. 2B illustrates a graphical representation of an embodiment of the invention with a low in a cell.

FIG. 2B illustrates a graphical representation of an embodiment of the invention with a low in a cell.

The sensing time period begins with WL activation, (WL1, for example), to access the cell data while the other SET, (SETA, for example), can be activated and held for the remainder of the cycle to enable one gated inverter (InvA) for sensing. The arrows in FIG. 2B depict the timing events, for example the arrow in preset time period shows the falling edge event of the SETB, causes the rising edge event of BL1. Additionally sequence of arrows in the sense period show the WL rising event causing a weak falling event on BL1, which in turn causes a weak rising event on BL2 which feeds back, causing the strong falling event on BL1, which in turn causes the final strong rising event on BL2. The weak and strong events are further indicated by the respective slope of the BL1 and BL2 signals, with a shallow slope representing a weak event and a steep slope representing a strong event.

After the sensing time period is complete, a write back period begins where the SET, (SETB, for example), of the bit-line being sensed (BL1) is activated to write-back data onto the BL being sensed.

Figure 3:
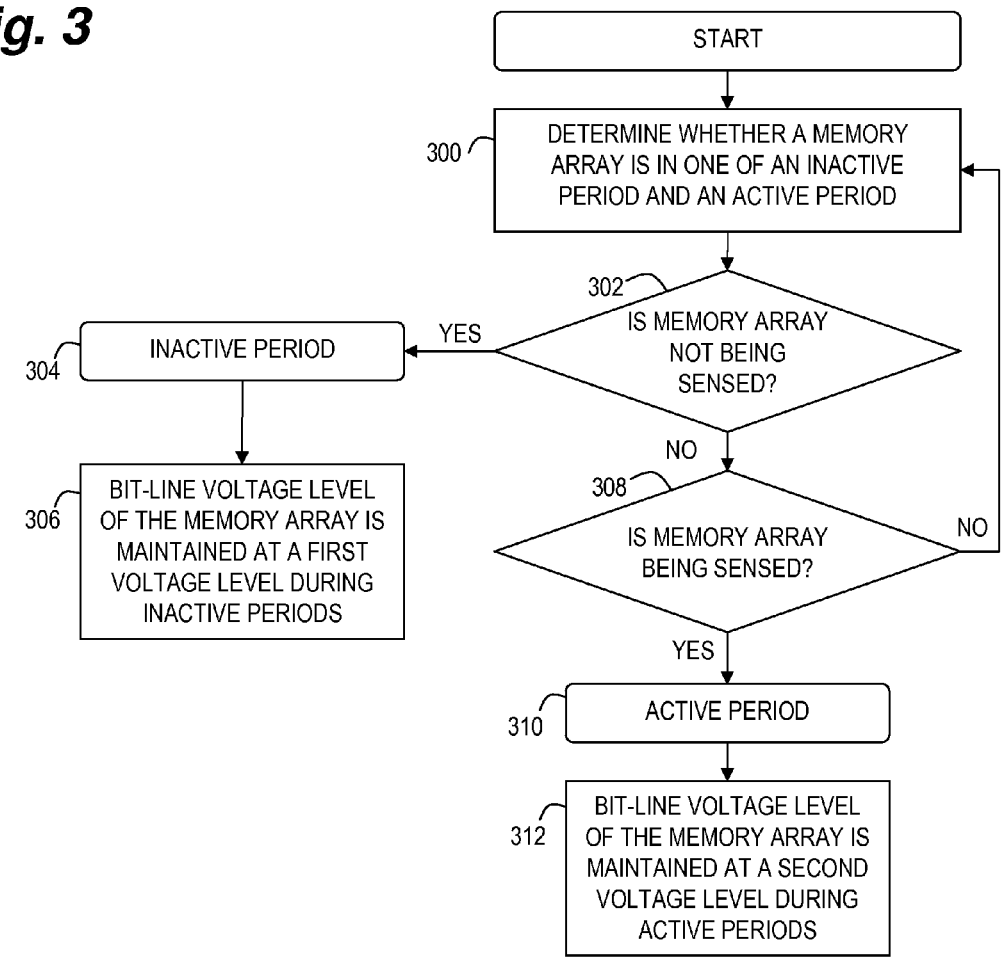
FIG. 3 illustrates a logical flowchart diagram of a method of an embodiment of the invention.

FIG. 3 illustrates a method of operation of one embodiment of the invention. First, a determination must be made as to whether a memory array is in one of an inactive period and an active period, 300. This involves determining whether a memory array is not being sensed 302. If no memory array is being sensed, a determination is made that the memory array is in an inactive period 304, and a bit-line voltage level of the memory array is maintained at a first voltage level during inactive periods, 306. The first voltage level includes a voltage level that is optimized to reduce memory cell leakage, for example, a "0" or ground voltage.

If the memory array is being sensed, 308, a determination is made that the memory array is in an active period 310, and the bit-line voltage level of the memory array is maintained at a second voltage level during active periods 312. The second voltage level includes a voltage level that is optimized for signal sensing, for example, a high voltage signal, (Vdd/VBLH).

A memory array includes a plurality of dynamic random access memory (DRAM) cells, CELL A, CELL B, for example, connected to a bit-line, BL1, BL2, for example. Each DRAM cell includes an N-type field effect transistor (NFET) access transistor, T1, T2, coupled to the bit-line, BL1, BL2. The method maintains the first voltage level at a level lower than the second voltage level. In an alternative embodiment, the first voltage level is maintained at a zero (0) level, and the second voltage level is maintained at a normal operating voltage level (VDD) of the memory array.

In an alternative embodiment, each DRAM cell, CELL A, CELL B, includes a P-type field effect transistor (PFET) access transistor SET A, SET B, coupled to the bit-line, BL1, BL2, for example. The method maintains the first voltage level, in this case, VDD/VHigh, at a level higher than the second voltage level, (GND, or "0"). In an alternative embodiment, the first voltage level is maintained at a normal operating voltage level (VDD) of the memory array, and the second voltage level is maintained at a zero (0) level.

Figure 4:
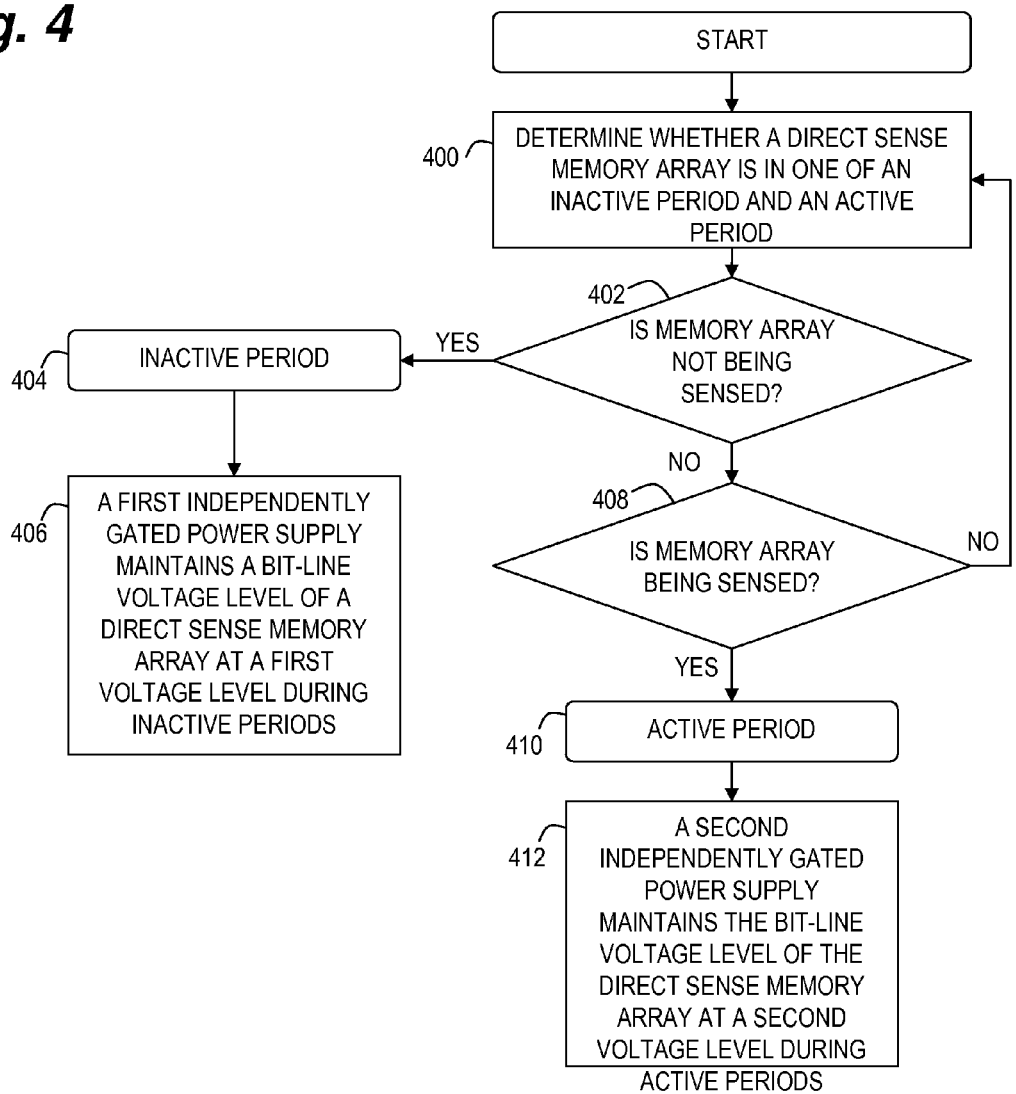
FIG. 4 illustrates a logical flowchart diagram of a method of an embodiment of the invention.

FIG. 4 illustrates an alternative embodiment of the invention which includes a method to determine whether a direct sense memory array is in one of an inactive period and an active period 400. If no memory array is being sensed 402, a determination is made that the memory array is in an inactive period 404, where a first independently gated power supply (106, 108) maintains a bit-line voltage level of a direct sense memory array at a first voltage level during the inactive period 406. Again, the first voltage level includes a voltage level that is optimized to reduce memory cell leakage, for example, a "0" or ground voltage.

If the memory array is being sensed, 408, a determination is made that the memory array is in an active period 410, a second independently gated power supply (the other of 106, 108), maintains the bit-line voltage level of the direct sense memory array at a second voltage level during active periods 412. The second voltage level includes a voltage level that is optimized for signal sensing, for example, a high voltage signal, (Vdd/VBLH).

The embodiments of the present invention's VDD Pre-Set Proposal allows a high Transfer Ratio where NFET array devices favor a VDD Pre-Charge. The embodiments of the invention shift signal from Write 1's dependence to Write 0's dependence. 0's write and read much faster with NFET array devices 0's, and 0's have better retention characteristics since Vgs are more negative as cell node leaks up (Vg=VWL, Vs=Node). Additionally, (silicon on insulator) SOI requires GND pre-charge to control Floating Body. The embodiments of the invention are a hybrid solution that combine a pre-charge bit-line to GND for Standby periods, and pre-set bit-line to VDD prior to sensing periods, thus providing faster read/write performance.

The present embodiments of the invention have a VDD Pre-Set Advantage in read performance where the VDD Pre-Set performance is dictated by read 0's, overdrive is maintained, weakly written 1's, due to high array Vt, are weakly read (good margin).

Furthermore, Signal=(Vbl−Vnode)*Tratio, (transfer ratio) is improved since VDD Pre-Set provides a greater VPP Margin, VPP>Inverter Trip+WC Array VT.

Additionally, fast refresh is accomplished by VDD Pre-Set that automatically refreshes 1's and Self Timed 0's. A Fast Read combined with Fast Write 0's, with a 1.5 ns cycle is possible. The Direct Read Inverter provides high voltage leakage margin since only the selected LBL is Hi-Z (driven by the cell).

With its unique and novel features, the embodiments of the invention may provide a method of operating a DRAM sensing architecture where a direct sense system has bit-lines restored to GND to minimize sub-Vt leakage in an SOI technology, and then presets a selected bit-line to Vdd prior to sensing to improve sensing of a high data state in the DRAM cell.

As will be appreciated by one skilled in the art, an embodiment of the invention may be embodied as a system, method or computer program product. Accordingly, an embodiment of the invention may take the form of an entirely hardware embodiment, an entirely software embodiment (including firmware, resident software, micro-code, etc.) or an embodiment combining software and hardware aspects that may all generally be referred to herein as a 'circuit,' 'module' or 'system.' Furthermore, an embodiment of the invention may take the form of a computer program product embodied in any tangible medium of expression having computerusable program code embodied in the medium.

Any combination of one or more computer usable or computer readable medium(s) may be utilized. The computer-usable or computer-readable medium may be, for example but not limited to, an electronic, magnetic, optical, electro-magnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of an embodiment of the invention may be written in any combination of one or more programming languages, including an object oriented programming language such as Java, Smalltalk, C++ or the like and conventional procedural programming languages, such as the 'C' programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

An embodiment of the invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 5:
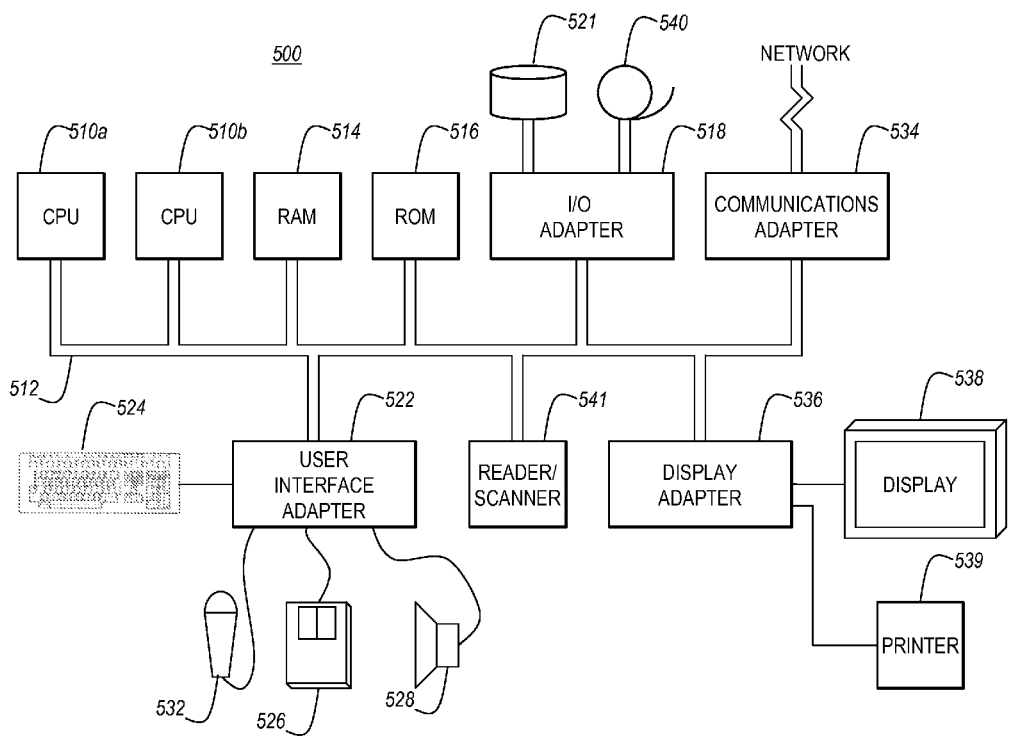
FIG. 5 illustrates a schematic diagram of a computer system for operating one embodiment of a method of the invention.

Referring now to FIG. 5, system 500 illustrates a typical hardware configuration which may be used for implementing the inventive system and method for operating a DRAM sensing architecture where a direct sense system has bit-lines restored to GND to minimize sub-Vt leakage in an SOI technology, and then presets a selected bit-line to Vdd prior to sensing to improve sensing of a high data state in the DRAM cell. The configuration has preferably at least one processor or central processing unit (CPU) 510*a*, 510*b*. The CPUs 510*a*, 510*b* are interconnected via a system bus 512 to a random access memory (RAM) 514, read-only memory (ROM) 516, input/output (I/O) adapter 518 (for connecting peripheral devices such as disk units 521 and tape drives 540 to the bus 512), user interface adapter 522 (for connecting a keyboard 524, mouse 526, speaker 528, microphone 532, and/or other user interface device to the bus 512), a communication adapter 534 for connecting an information handling system to a data processing network, the Internet, and Intranet, a personal area network (PAN), etc., and a display adapter 536 for connecting the bus 512 to a display device 538 and/or printer 539. Further, an automated reader/scanner 541 may be included. Such readers/scanners are commercially available from many sources.

In addition to the system described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including signal-bearing media tangibly embodying a program of machine-readable instructions executable by a digital data processor to perform the above method.

Such a method may be implemented, for example, by operating the CPU 510 to execute a sequence of machine-readable instructions. These instructions may reside in various types of signal bearing media.

Thus, this aspect of the present invention is directed to a programmed product, comprising signal-bearing media tangibly embodying a program of machine-readable instructions executable by a digital data processor incorporating the CPU 510 and hardware above, to perform the method of the invention.

The flowchart and block diagrams in the Figures illustrate the architecture, functionality, and operation of possible implementations of systems, methods and computer program products according to various embodiments of the invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of any embodiments of the invention. As used herein, the singular forms 'a', 'an' and 'the' are intended to include the plural forms as well, unless the context clearly indicates otherwise. It will be further understood that the terms 'comprises' and/or 'comprising,' when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments of the invention has been presented for purposes of illustration and description, but is not intended to be exhaustive or limited to the embodiments of the invention in the form disclosed. Many modifications and variations will be apparent to those of ordinary skill in the art without departing from the scope and spirit of the embodiments of the invention. The embodiment was chosen and described in order to best explain the principles of the embodiments of the invention and the practical application, and to enable others of ordinary skill in the art to understand the embodiments of the invention for various embodiments with various modifications as are suited to the particular use contemplated.

What is claimed is:

1. A method comprising:
   determining whether a memory array is in one of an inactive period and an active period, said memory array including a plurality of dynamic random access memory (DRAM) cells connected to a plurality of bit-lines, and a plurality of inverters connected between pairs of said DRAM cells by said bit-lines;
   maintaining a bit-line voltage level of said memory array at a first voltage level during inactive periods by connecting said bit-lines to a first independently gated power supply through said inverters; and
   maintaining said bit-line voltage level of said memory array at a second voltage level during active periods by connecting said bit-lines to a second independently gated power supply through said inverters,
   said inactive periods comprising times when said memory array is not being sensed,
   said active periods comprising times when said memory array is being sensed,
   said first voltage level comprising a voltage level that is optimized to reduce memory cell leakage, and
   said second voltage level comprising a voltage level that is optimized for signal sensing.

2. The method according to claim 1, each DRAM cell comprising an N-type field effect transistor (NFET) access transistor coupled to said bit-line, said method further comprises:
   maintaining said first voltage level at a level lower than said second voltage level.

3. The method according to claim 1, each DRAM cell comprising a P-type field effect transistor (PFET) access transistor coupled to said bit-line, said method further comprises:
   maintaining said first voltage level at a level higher than said second voltage level.

4. The method according to claim 1, each DRAM cell comprising an N-type field effect transistor (NFET) access transistor coupled to said bit-line, said method further comprises:
   maintaining said first voltage level at a zero (0) level; and
   maintaining said second voltage level at a normal operating voltage level of said memory array.

5. The method according to claim 1, each DRAM cell comprising a P-type field effect transistor (PFET) access transistor coupled to said bit-line, said method further comprises:
maintaining said first voltage level at a normal operating voltage level of said memory array; and
maintaining said second voltage level at a zero (0) level.

6. A method comprising:
determining whether a direct sense memory array is in one of an inactive period and an active period, said direct sense memory array including a plurality of a plurality of dynamic random access memory (DRAM) cells connected to a plurality of bit-lines, and a plurality of inverters connected between pairs of said DRAM cells by said bit-lines;
using a first independently gated power supply connected to said bit-lines through said inverters to maintain a bit-line voltage level of a direct sense memory array at a first voltage level during inactive periods; and
using a second independently gated power supply connected to said bit-lines through said inverters to maintain said bit-line voltage level of said direct sense memory array at a second voltage level during active periods,
said inactive periods comprising times when said direct sense memory array is not being sensed,
said active periods comprising times when said direct sense memory array is being sensed,
said first voltage level comprising a voltage level that is optimized to reduce memory cell leakage, and
said second voltage level comprising a voltage level that is optimized for signal sensing.

7. The method according to claim 6, each DRAM cell comprising an N-type field effect transistor (NFET) access transistor coupled to said bit-line, said method further comprises:
maintaining said first voltage level at a lower level than said second voltage level.

8. The method according to claim 6, each DRAM cell comprising a P-type field effect transistor (PFET) access transistor coupled to said bit-line, said method further comprises:
maintaining said first voltage level at a level higher than said second voltage level.

9. The method according to claim 6, each DRAM cell comprising an N-type field effect transistor (NFET) access transistor coupled to said bit-line, said method further comprises:
maintaining said first voltage level at a zero (0) level; and
maintaining said second voltage level at a normal operating voltage level of said direct sense memory array.

10. The method according to claim 6, each DRAM cell comprising a P-type field effect transistor (PFET) access transistor coupled to said bit-line, the method further comprising:
maintaining said first voltage level at a normal operating voltage level of said direct sense memory array; and
maintaining said second voltage level at a zero (0) level.

11. A memory array comprising:
a plurality of bit-lines;
a plurality of dynamic random access memory (DRAM) cells, each DRAM cell of said DRAM cells being connected to a corresponding bit-line of said bit-lines by an access transistor;
a plurality of inverters connected between pairs of said DRAM cells by said bit-lines;
a first circuit connected to said bit-lines through said inverters, said first circuit maintaining said bit-lines at a first voltage level during inactive periods; and
a second circuit connected to said bit-lines through said inverters, said second circuit maintaining said bit-lines at a second voltage level during active periods,
said inactive periods comprising times when said memory array is not being sensed,
said active periods comprising times when said memory array is being sensed,
said first voltage level comprising a voltage level that is optimized to reduce memory cell leakage, and
said second voltage level comprising a voltage level that is optimized for signal sensing.

12. The memory array according to claim 11, said access transistor comprising:
an N-type field effect transistor (NFET) access transistor coupled to said bit-line,
said first voltage level being lower than said second voltage level.

13. The memory array according to claim 11, said access transistor comprising:
a P-type field effect transistor (PFET) access transistor coupled to said bit-line,
said first voltage level being higher than said second voltage level.

14. The memory array according to claim 11, said access transistor comprising:
an N-type field effect transistor (NFET) access transistor coupled to said bit-line,
said first voltage level comprising zero (0), and
said second voltage level comprising a normal operating voltage of said memory array.

15. The memory array according to claim 11, said access transistor comprising:
a P-type field effect transistor (PFET) access transistor coupled to said bit-line,
said first voltage level comprising a normal operating voltage of said memory array, and
said second voltage level comprising zero (0).

16. A direct sense memory array comprising:
a plurality of bit-lines;
a plurality of dynamic random access memory (DRAM) cells, each DRAM cell of said DRAM cells being connected to a corresponding bit-line of said bit-lines by an access transistor;
a plurality of inverters connected between pairs of said DRAM cells by said bit-lines;
a first independently gated power supply connected to said bit-lines through said inverters, said first independently gated power supply maintaining said bit-lines at a first voltage level during inactive periods; and
a second independently gated power supply connected to said bit-lines through said inverters, said second independently gated power supply maintaining said bit-lines at a second voltage level during active periods,
said inactive periods comprising times when said direct sense memory array is not being sensed,
said active periods comprising times when said direct sense memory array is being sensed,
said first voltage level comprising a voltage level that is optimized to reduce memory cell leakage, and
said second voltage level comprising a voltage level that is optimized for signal sensing.

17. The direct sense memory array according to claim 16, said access transistor comprising:
   an N-type field effect transistor (NFET) access transistor coupled to said bit-line,
   said first voltage level being lower than said second voltage level.

18. The direct sense memory array according to claim 16, said access transistor comprising:
   a P-type field effect transistor (PFET) access transistor coupled to said bit-line,
   said first voltage level being higher than said second voltage level.

19. The direct sense memory array according to claim 16, said access transistor comprising:
   an N-type field effect transistor (NFET) access transistor coupled to said bit-line,
   said first voltage level comprising zero, and
   said second voltage level comprising a normal operating voltage of said direct sense memory array.

20. The direct sense memory array according to claim 16, said access transistor comprising:
   a P-type field effect transistor (PFET) access transistor coupled to said bit-line,
   said first voltage level comprising a normal operating voltage of said direct sense memory array, and
   said second voltage level comprising zero.

\* \* \* \* \*